United States Patent
Song

(10) Patent No.: US 7,151,429 B2
(45) Date of Patent: Dec. 19, 2006

(54) INDUCTOR ELEMENT HAVING A HIGH QUALITY FACTOR

(75) Inventor: In-sang Song, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/309,213

(22) Filed: Dec. 4, 2002

(65) Prior Publication Data

US 2003/0184426 A1    Oct. 2, 2003

(30) Foreign Application Priority Data

Dec. 6, 2001    (KR) ............... 10-2001-0076981

(51) Int. Cl.
*H01F 5/00*    (2006.01)
(52) U.S. Cl. ............... 336/200; 336/223; 336/84 R
(58) Field of Classification Search ............... 336/200, 336/223, 84, 83, 221, 232, 84 R, 84 C, 84 M
See application file for complete search history.

(56) References Cited

U.S. PATENT DOCUMENTS

| | | | |
|---|---|---|---|
| 3,898,595 A | | 8/1975 | Launt |
| 5,349,321 A | * | 9/1994 | Selker ............... 336/221 |
| 5,373,112 A | | 12/1994 | Kamimura et al. |
| 5,539,241 A | | 7/1996 | Abidi et al. |
| 5,747,870 A | | 5/1998 | Pedder |
| 5,884,990 A | * | 3/1999 | Burghartz et al. ......... 336/200 |
| 5,959,522 A | * | 9/1999 | Andrews ............... 336/200 |
| 6,166,422 A | * | 12/2000 | Qian et al. ............... 257/531 |
| 6,310,387 B1 | | 10/2001 | Seefeldt et al. |
| 6,535,098 B1 | * | 3/2003 | Yeo et al. ............... 336/200 |
| 6,593,841 B1 | * | 7/2003 | Mizoguchi et al. ......... 336/200 |
| 6,680,665 B1 | * | 1/2004 | Aoki et al. ............... 336/174 |
| 6,696,744 B1 | * | 2/2004 | Feygenson et al. ......... 257/531 |
| 6,696,910 B1 | * | 2/2004 | Nuytkens et al. ........... 336/200 |
| 6,856,226 B1 | * | 2/2005 | Gardner ............... 336/192 |
| 2001/0024739 A1 | | 9/2001 | Mizoguchi et al. |

FOREIGN PATENT DOCUMENTS

| | | |
|---|---|---|
| JP | 05-235554 | 9/1993 |
| JP | 06-077055 | 3/1994 |
| JP | 2001-060516 | 3/2001 |

* cited by examiner

*Primary Examiner*—Anh Mai
(74) *Attorney, Agent, or Firm*—Lee & Morse, P.C.

(57) ABSTRACT

An inductor element having a high quality factor, wherein the inductor element includes an inductor helically formed on a semiconductor substrate and a magnetic material film on a surface of the inductor for inducing magnetic flux generated by the inductor. The magnetic material film preferably includes a first magnetic material film disposed on a lower surface of the inductor, between the substrate and the inductor, and a second magnetic material film disposed on an upper surface of the inductor. The magnetic material film may be patterned according to a direction along which the magnetic flux flows, for example, radially. Since the magnetic flux proceeding toward the upper part and lower part of the inductor is induced by the magnetic material film, the effect of the magnetic flux generated in the inductor on external circuits may be reduced and the efficiency of the inductor may be enhanced.

13 Claims, 3 Drawing Sheets

INDUCTOR ELEMENT HAVING A HIGH QUALITY FACTOR

BACKGROUND OF THE INVENTION

1. Field of the Invention

The present invention relates to an inductor element. More particularly, the present invention relates to a high efficiency inductor element capable of minimizing leakage flux and capable of minimizing an effect of leakage flux on external elements.

2. Description of the Related Art

Micro Electro Mechanical System (MEMS) technology is used in the manufacture of mechanical and electrical parts utilized in semiconductor processing. An inductor element is one example of an element that can be manufactured using MEMS technology.

An inductor element is formed to supply magnetic flux to another element that requires the flux, for example, a capacitor in an LC resonant circuit. Accordingly, in the manufacture of the inductor, a critical design consideration is that the magnetic flux generated in the inductor is supplied only to the element requiring the flux and not to other elements.

Examples of an inductor element using MEMS technology or multi-chip module (MCM) technology are conventionally known. However, conventional inductor elements present several disadvantages. First, one conventional inductor element presents the disadvantage that a packaging process should be carried out for every element. Second, another conventional inductor element presents the disadvantage that magnetic flux generated in the inductor is propagated to the upper and lower parts of the inductor, thereby affecting other circuits. Accordingly, these conventional inductor elements have a problem in that other circuits may not successfully operate because the magnetic flux from the inductor exerts a detrimental influence on other circuits. Also, as magnetic flux generated in the inductor leaks to other parts, the performance of the inductor deteriorates, resulting in a decrease of a quality factor (Q value).

SUMMARY OF THE INVENTION

It is a feature of an embodiment of the present invention to provide an inductor element capable of preventing magnetic flux generated in the inductor from flowing into other unintended circuit parts and also having a high quality factor (Q value).

In order to provide the above feature, an inductor element according to an embodiment of the present invention includes a substrate; an inductor helically formed on the substrate for generating magnetic flux upon application of an electric current; and a magnetic material film disposed on a surface of the inductor for inducing the magnetic flux generated by the inductor, the magnetic material film being formed of a magnetic material. Preferably, the magnetic material film is disposed between the inductor and the substrate. Preferably, the magnetic material film is formed of a material such as nickel or cobalt.

Preferably, the magnetic material film includes a first magnetic material film disposed on a lower surface of the inductor and a second magnetic material film disposed on an upper surface of the inductor. In an embodiment of the present invention, the first and second magnetic material films are connected to each other by magnetic flux guides formed of a magnetic material. Therefore, magnetic flux generated in the inductor is induced by a closed loop made up by the magnetic material films and the magnetic flux guides. Preferably, the magnetic flux guides are disposed at an outer part of the inductor.

The magnetic material film may be patterned according to a direction along which the magnetic flux generated by the inductor flows. Preferably, the magnetic material film is patterned in a radial shape to correspond to the flow of the magnetic flux generated by the inductor, thereby enhancing the effect of the induction of the magnetic flux.

Preferably, in another embodiment of the present invention, an electric field shielding layer may be disposed between the substrate and the inductor to intercept propagation of an electric field to the substrate. The electric field shielding layer may be disposed below the first magnetic material film, i.e., between the substrate and the first magnetic material film or it may be disposed above the first magnetic material film, i.e., between the first magnetic material film and the inductor. The electric field shielding layer may be formed of a material selected from the group consisting of gold, aluminum and copper. Further, an additional electric field shielding layer may be disposed above the inductor. Thus, the influence of an electric field may be minimized or prevented by the electric field shielding layer.

BRIEF DESCRIPTION OF THE DRAWINGS

The above and other features and advantages of the present invention will become readily apparent to those of ordinary skill in the art by the following detailed description of preferred embodiments thereof with reference to the attached drawings in which.

DETAILED DESCRIPTION OF THE INVENTION

Figure 1:
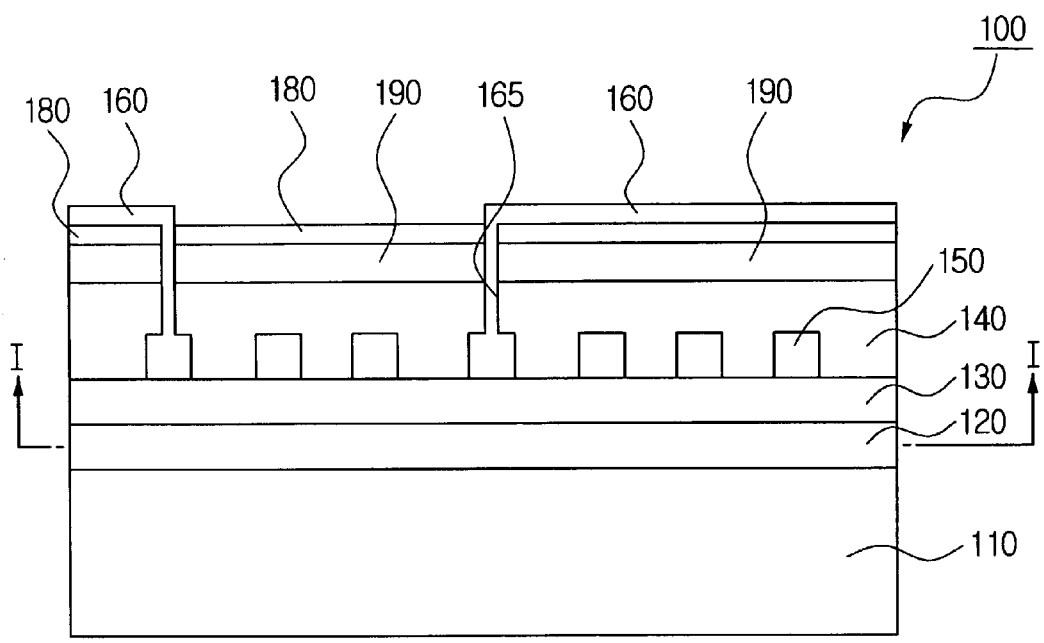
FIG. 1 illustrates a side sectional view showing a first embodiment of an inductor element according to the present invention.

Korean Patent Application No. 2001-76981, filed Dec. 6, 2001, and entitled: "Inductor Element Having High Quality Factor," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout.

FIG. 1 illustrates a side sectional view showing a first embodiment of the inductor element 100 according to the present invention. The inductor element according to the present invention includes a substrate 110, an inductor 150 formed in a helical shape on the substrate, a first magnetic material film 120 disposed between the substrate 110 and the inductor 150 and a second magnetic material film 190 disposed on the top of the inductor 150.

The substrate 110 is formed of a semiconductor or a dielectric substance. The inductor 150 is generally formed of a metallic material. The first magnetic material film 120 and the second magnetic material film 190 are formed of a substance capable of inducing magnetic flux, including, for example, nickel (Ni) or cobalt (Co).

A first dielectric layer 130 formed of a dielectric material is disposed between the substrate 110 and the inductor 150. In addition, the layer upon which the inductor 150 is formed is filled with a second dielectric layer 140. The first dielectric layer 130 and the second dielectric layer 140 are formed of the same material, preferably BCB (BenzoCycloButene) or polyimide having a low dielectric constant. As shown in FIG. 1, the first magnetic material film 120 is disposed between the substrate 110 and the first dielectric layer 130. The second magnetic material film 190 is disposed on the top of the second dielectric layer 140.

A third dielectric layer 180 is formed over the second magnetic material film 190. Over the third dielectric layer 180, a power terminal 160 is formed to be connected to the inductor 150. The third dielectric layer 180, the second magnetic material film 190 and the second dielectric layer 140 are provided with two openings 165, through which the power terminal 160 is connected to both ends of the helical inductor 150. An electric current applied through the power terminal 160 is supplied to the inductor 150, upon which magnetic flux is generated in the inductor 150. The power terminal 160 is preferably formed of the same material as the inductor 150.

The magnetic flux generated in the inductor 150 forms a closed curve passing through a central part of the helical inductor 150. At this time, the magnetic flux passing through the upper and lower parts of the inductor 150 is induced to the interior by the first magnetic material film 120 and the second magnetic material film 190, respectively. Therefore, the magnetic flux is prevented from leaking to the interior of the substrate under the first magnetic material film 120 or other parts over the second magnetic material film 190, whereby the influence of the leakage flux on other circuits is minimized and the Q value of the inductor is increased, thereby causing an increase in the efficiency of the device.

In the embodiment shown in FIG. 1, the first magnetic material film 120 and the second magnetic material film 190 are disposed below and above the inductor 150, respectively. In an alternate arrangement, only one of the two films may be provided. For example, if there is no need to prevent the induction of the magnetic flux toward the substrate 110, for example, in the case when no other circuits are disposed under the substrate 110, only the second magnetic material film 190 may be provided and the first magnetic material film may be omitted.

In addition, although not shown in FIG. 1, a conductive layer may be provided between the first magnetic material film 120 and the inductor 150 to connect other elements requiring the magnetic flux generated in the inductor 150. An example of a use of this conductive layer arises when the inductor element prepared as described above is intended to be used in the manufacture of an RF element such as a voltage controlled oscillator (VCO) for oscillating a frequency using an LC resonant circuit. In that case, the conductive layer (not shown) should be disposed between the first magnetic material film 120 and the inductor 150 to electrically connect the capacitor in the VCO with the inductor 150. Here, the conductive layer is preferably provided with insulating layers at both sides thereof so that it is insulated from the first magnetic material film 120 and the inductor 150, in which the conductive layer is electrically connected to the inductor 150 through a through hole formed in the insulating layer and the dielectric layer 130.

Figure 2:
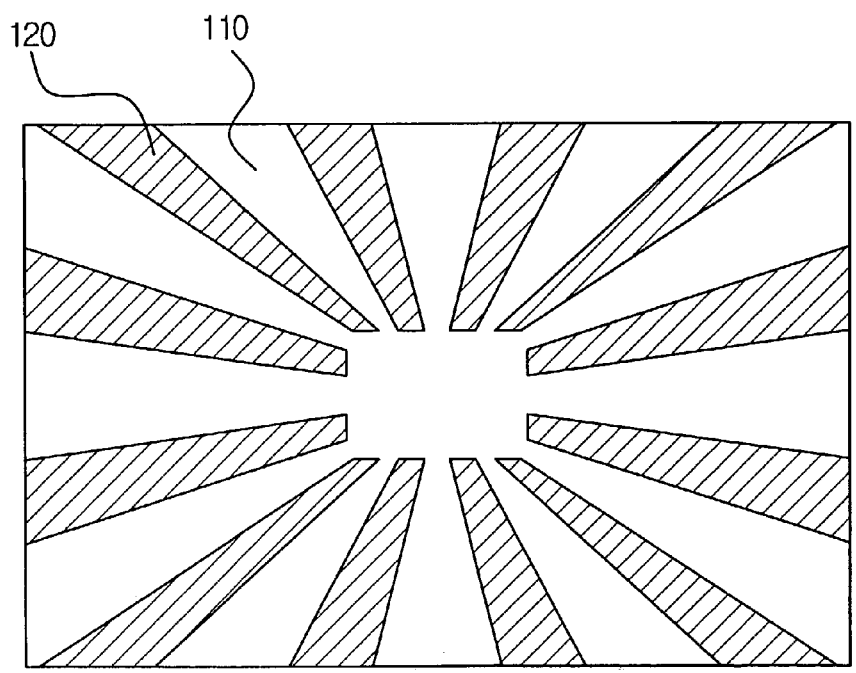
FIG. 2 illustrates a sectional view along the line I—I of FIG. 1.

FIG. 2 illustrates a sectional view along the line I—I of FIG. 1. As shown in FIG. 2, the first magnetic material film 120 is patterned in a radial shape. Since the inductor 150 is formed in a helical shape on the substrate 110, the magnetic flux generated by the inductor 150 flows out radially from a central part of the substrate 110 to an outer part or flows in radially from the outer part to the central part. Therefore, by patterning the first magnetic material film 120 in a radial shape to correspond to the direction along which the magnetic flux flows, the effect of the first magnetic material film 120 to induce the magnetic flux is increased. The second magnetic material film 190 may also be patterned in a radial shape. For convenience of illustration, FIG. 2 shows the pattern being formed less densely. In practice, however, the magnetic material film 120 is patterned more densely than that shown in FIG. 2 to increase the effect of the induction of the magnetic flux.

Figure 3:
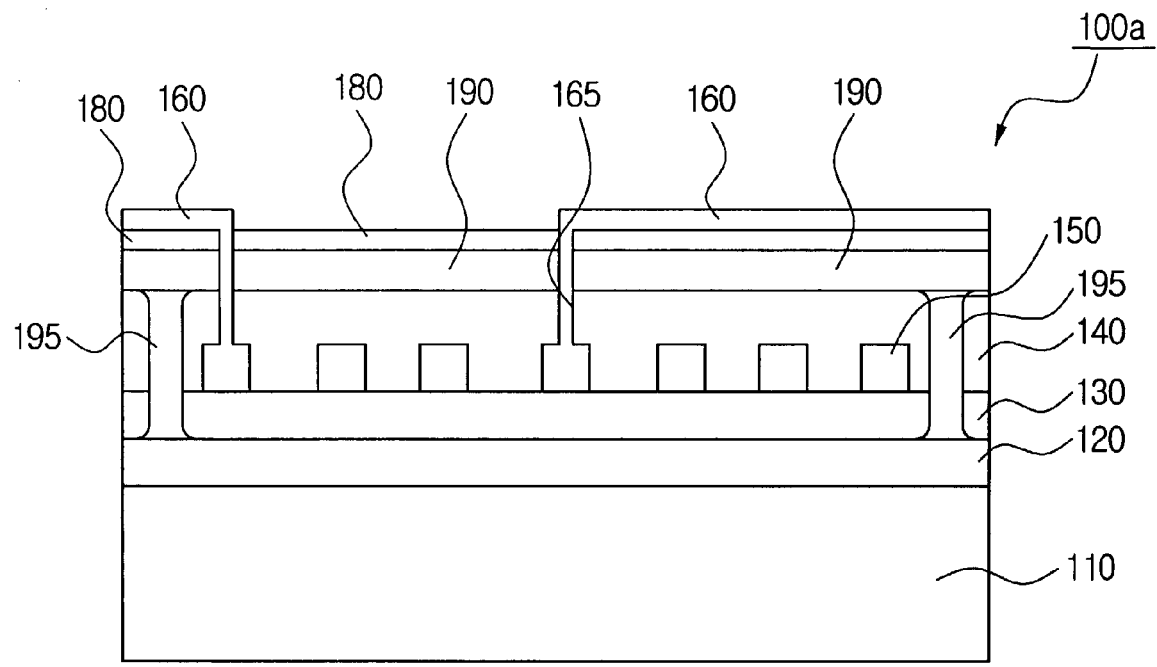
FIG. 3 illustrates a side sectional view showing a second embodiment of an inductor element according to the present invention.

FIG. 3 illustrates a side sectional view showing a second embodiment of the present invention.

In the inductor element 100a shown in FIG. 3, arrangement of a substrate 110, first and second magnetic material films 120, 190, first to third dielectric layers 130, 140, 180, an inductor 150, and the power terminal 160 and related openings 165 are the same as described in connection with FIG. 1. The inductor element 100a according to the second embodiment additionally has a pair of magnetic flux guides 195 for connecting the first magnetic material film 120 and the second magnetic material film 190.

The magnetic flux guides 195 are formed of a magnetic material, similarly to the first and second magnetic material films 120, 190. The magnetic flux guides 195 are disposed at an outer part of the inductor 150 and form a closed curve with the first and second magnetic material films 120, 190. Thus, magnetic flux generated in the inductor 150 is guided by the first magnetic material film 120, the magnetic flux guides 195 and the second magnetic material film 190, in which the magnetic flux guides function to further increase the effect of the induction of magnetic flux and consequently, the loss of the inductor 150 is reduced.

Figure 4:
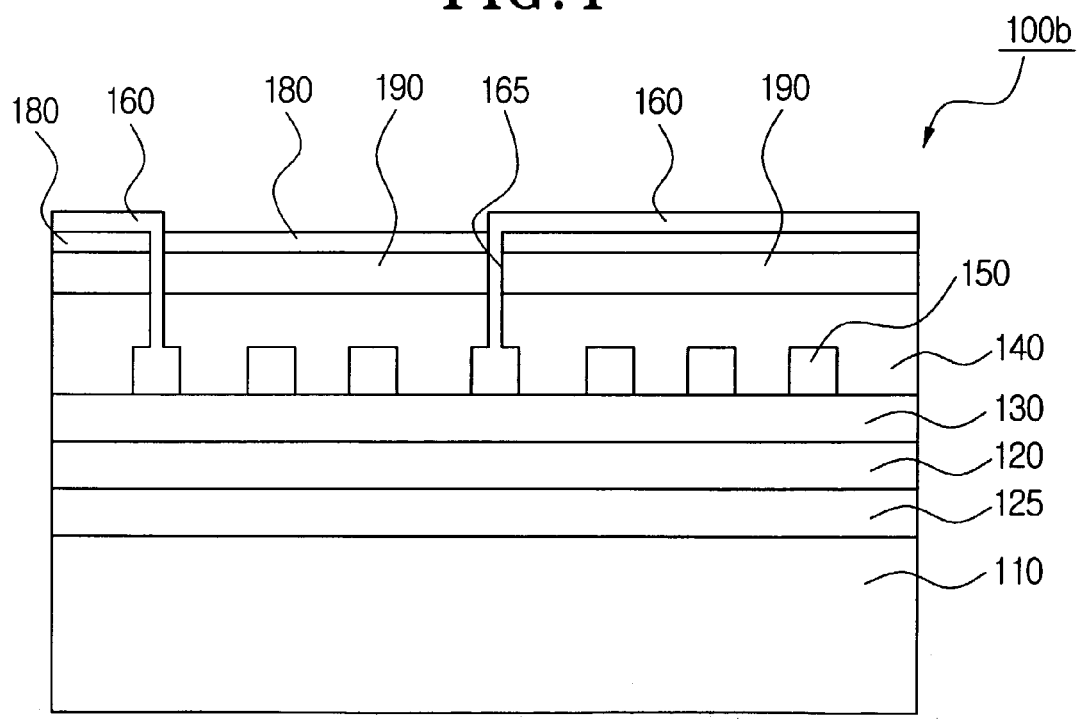
FIG. 4 illustrates a side sectional view showing a third embodiment of an inductor element according to the present invention.

FIG. 4 illustrates a side sectional view showing a third embodiment of the present invention.

In the inductor element 100b shown in FIG. 4, arrangement of a substrate 110, first and second magnetic material films 120, 190, first to third dielectric layers 130, 140, 180, an inductor 150, and a power terminal 160 and the related openings 165 are the same as described in connection with FIG. 1. The inductor element 100b according to the third embodiment further includes an electric field shielding layer 125 disposed below the first magnetic material film 120, i.e., between the substrate 110 and the first magnetic material film 120.

The electric field shielding layer 125 is formed of a metallic material such as Au, Al or Cu. The electric field shielding layer 125 functions to intercept the propagation of the electric field generated from the inductor and the application of an external electric field. Therefore, an advantage of the third embodiment of the present invention is that it may reduce the effect of not only magnetic flux, but also an electric field on other elements.

Figure 5:
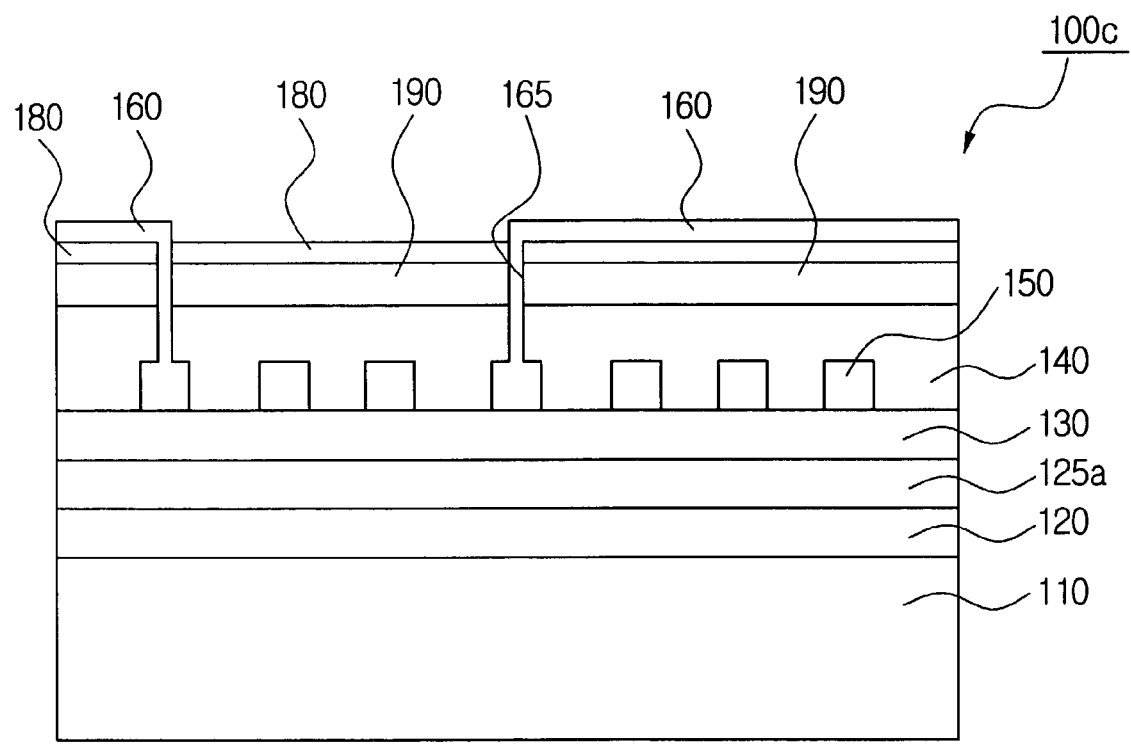
FIG. 5 illustrates a side sectional view showing a fourth embodiment of an inductor element according to the present invention.

FIG. 5 illustrates a side sectional view showing a fourth embodiment of the present invention. The fourth embodiment has substantially the same arrangement as that of the inductor element 100b as shown in FIG. 4. A difference is that an electric field shielding layer 125a is disposed above the first magnetic material film 120, i.e., between the first magnetic material film 120 and the first dielectric layer 130 and the inductor 150 in the inductor element 100c. In the fourth embodiment the position of the electric field shielding layer 125a and the position of the first magnetic material film 120 are switched from the arrangement of the third embodiment. The magnetic field and electric field shielding effects of this arrangement are similar to that of the arrangement of FIG. 4.

In addition, although not shown in FIG. 4 or 5, an additional electric field shielding layer may be disposed above the inductor 150, as may be required.

The embodiments of the present invention are advantageous over conventional arrangements of inductor elements in that the effect of magnetic flux generated in the inductor on outside elements may be reduced and the efficiency of the inductor may be increased.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An inductor element formed on a substrate, the inductor element comprising:
   an inductor helically formed on the substrate for generating magnetic flux upon application of an electric current and disposed on a first dielectric layer beneath a second dielectric layer;
   a magnetic material film disposed on the substrate, the magnetic material film being a planar layer that extends along a first plane; and
   at least one of (i) a first electric field shielding layer disposed between the first dielectric layer and the magnetic material film and (ii) a second electric field shielding layer disposed above the inductor,
   wherein the magnetic material film has a substantially radial shape that induces magnetic flux generated by the inductor, the radial shape corresponding to a direction of flow of the generated magnetic flux.

2. An inductor element formed on a substrate, the inductor element comprising:
   an inductor helically formed on the substrate for generating magnetic flux upon application of an electric current and disposed on a first dielectric layer beneath a second dielectric layer; and
   a magnetic material film formed on the second dielectric layer, the magnetic material film being a planar layer that extends along a first plane,
   wherein the magnetic material film has a substantially radial shape that induces magnetic flux generated by the inductor, the radial shape corresponding to a direction of flow of the generated magnetic flux.

3. An inductor element formed on a substrate, the inductor element comprising:
   an inductor helically formed on the substrate for generating magnetic flux upon application of an electric current and disposed on a first dielectric layer beneath a second dielectric layer, the dielectric layers comprising a plurality of openings propagating from the second dielectric layer into the first dielectric layer and arranged in a substantially circular pattern disposed outside a perimeter of the inductor;
   a first magnetic material film formed on the substrate and a second magnetic material film formed on the second dielectric layer, the magnetic material films extending outside the perimeter of the inductor, the first magnetic material film and the second magnetic material film being planar layers that respectively extend along a first plane and a second plane; and
   a plurality of magnetic flux guides disposed in the said openings and magnetically coupling the first magnetic material film to the second magnetic material film, wherein at least one of the first magnetic material film and the second magnetic material film has a substantially radial shape for inducing magnetic flux generated by the inductor, the radial shape corresponding to a direction of flow of the generated magnetic flux.

4. The inductor element according to claim 3, wherein the magnetic material film is formed of a material selected from the group consisting of nickel and cobalt.

5. The inductor element according to claim 3, wherein a portion of the first magnetic material film overlapping the inductor and a portion of the first magnetic material film extending outside the perimeter of the inductor extend along the first plane, and a portion of the second magnetic material film overlapping the inductor and a portion of the second magnetic material film extending outside the perimeter of the inductor extend along the second plane.

6. The inductor element according to claim 3, wherein the first magnetic material film and the second magnetic material film each have a substantially radial shape for inducing magnetic flux generated by the inductor, the radial shape corresponding to a direction of flow of the generated magnetic flux.

7. The inductor element according to claim 3, further comprising at least one of a first electric field shielding layer and a second electric field shielding layer disposed to intercept propagation of an electric field from or to the inductor.

8. The inductor element according to claim 7, wherein the first electric field shielding layer is disposed between the substrate and the first dielectric layer.

9. The inductor element according to claim 7, wherein the second electric field shielding layer is disposed above the inductor.

10. The inductor element according to claim 7, wherein the electric field shielding layer is formed using a material selected from the group consisting of gold, aluminum and copper.

11. The inductor element according to claim 7, wherein the first electric field shielding layer is disposed between the first dielectric layer and the magnetic material film.

12. The inductor element according to claim 3, further comprising at least one power terminal coupled to the inductor.

13. The inductor element according to claim 3, wherein the at least one power terminal is disposed on a third dielectric layer disposed on the magnetic material film.

* * * * *